United States Patent
Darr et al.

(10) Patent No.: US 9,462,702 B2
(45) Date of Patent: Oct. 4, 2016

(54) POWER DISTRIBUTION BOX

(71) Applicant: LEAR CORPORATION, Southfield, MI (US)

(72) Inventors: Christopher J. Darr, Livonia, MI (US); Peter Kowtun, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 147 days.

(21) Appl. No.: 14/478,439

(22) Filed: Sep. 5, 2014

(65) Prior Publication Data

US 2016/0073520 A1   Mar. 10, 2016

(51) Int. Cl.
| | |
|---|---|
| H05K 5/00 | (2006.01) |
| H05K 3/40 | (2006.01) |
| H05K 7/02 | (2006.01) |
| B60R 16/023 | (2006.01) |
| H01R 13/20 | (2006.01) |
| H01R 43/26 | (2006.01) |

(52) U.S. Cl.
CPC ............. *H05K 3/40* (2013.01); *B60R 16/0239* (2013.01); *H05K 7/026* (2013.01); *H01R 13/20* (2013.01); *H01R 43/26* (2013.01); *H01R 2201/26* (2013.01)

(58) Field of Classification Search
USPC ................................. 361/752, 748, 736, 753
See application file for complete search history.

(56) References Cited

U.S. PATENT DOCUMENTS

| | | |
|---|---|---|
| 4,390,219 A | 6/1983 | Beehler |
| 4,431,251 A | 2/1984 | Krantz |
| 4,669,793 A * | 6/1987 | Hayashi ............... H01R 12/716 439/338 |
| 5,795,193 A | 8/1998 | Yang |
| 6,488,551 B1 | 12/2002 | Tomlin et al. |
| 6,780,026 B2 | 8/2004 | Sato |
| 7,283,366 B2 | 10/2007 | Yamashita |
| 8,690,588 B2 | 4/2014 | Jetton et al. |

FOREIGN PATENT DOCUMENTS

| | | |
|---|---|---|
| DE | 36 03 158 C2 | 7/1986 |
| DE | 101 56 035 A1 | 8/2002 |
| DE | 10 2005 014 406 A1 | 11/2005 |
| EP | 1482530 B1 | 1/2007 |

OTHER PUBLICATIONS

English Language Abstract of DE 10 2005 014 406 A1 dated Nov. 10, 2005.
English Language Abstract of DE 101 56 035 A1 dated Aug. 29, 2002.
English Language Abstract of EP 1 482 530 (A1) dated Dec. 1, 2004.

* cited by examiner

*Primary Examiner* — Andargie M Aychillhum
(74) *Attorney, Agent, or Firm* — Dykema Gossett PLLC

(57) ABSTRACT

An integrated power distribution box includes an upper level assembly with a printed circuit board including at least one electrical component, a lower housing configured to receive at least a portion of the printed circuit board, an intermediate housing configured to be coupled with at least one fuse, a master fuse electrically coupled to the printed circuit board, and a lower level assembly including at least one connector corresponding to at least one of the master fuse, the at least one electrical component, and the at least one fuse.

20 Claims, 8 Drawing Sheets

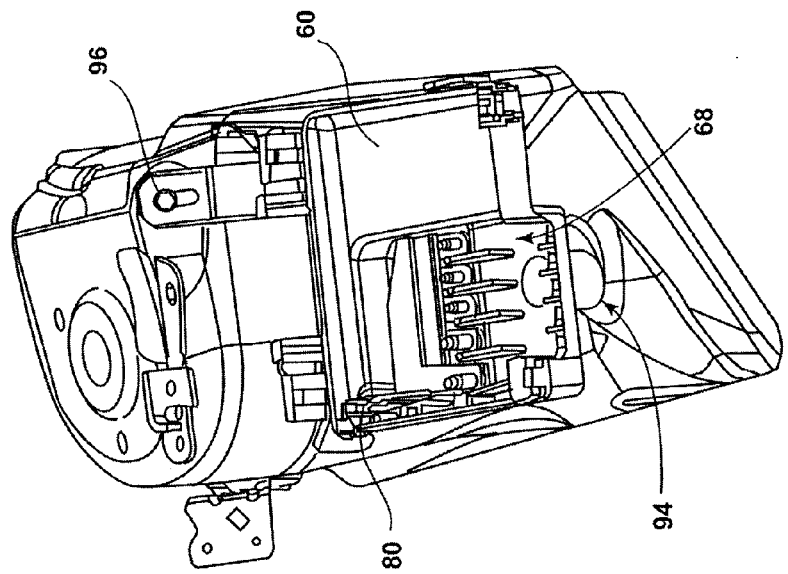
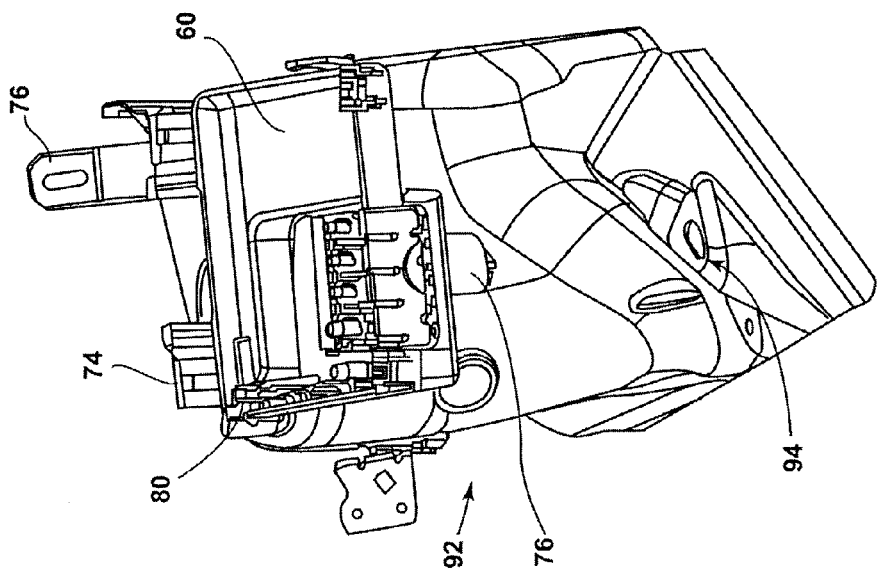
FIG. 7A
FIG. 7B

POWER DISTRIBUTION BOX

BACKGROUND

The present disclosure relates to power distribution boxes, including power distribution boxes that can be used, for example, to support a plurality of electrical components within a vehicle or a device.

SUMMARY

The present disclosure includes a power distribution box. In an embodiment, a power distribution box includes a first housing and a second housing. The first housing may include a first connection element, and the second housing may include a second connection element that is configured for engagement with the first connection element. In an embodiment, the first and second connection elements are configured to retain the first housing relative to the second housing, and the first and second elements may be configured to electrically connect the first housing and the second housing.

Various aspects of this invention will become apparent to those skilled in the art from the following detailed description of an embodiment of the present disclosure, when read in light of the accompanying drawings.

BRIEF DESCRIPTION OF THE DRAWINGS

FIGS. 7A-7D are partial perspective views of portions of an embodiment of a power distribution box and a vehicle in accordance with teachings of the present disclosure.

DETAILED DESCRIPTION

Reference will now be made in detail to embodiments of the present disclosure, examples of which are described herein and illustrated in the accompanying drawings. While the invention will be described in conjunction with embodiments, it will be understood that they are not intended to limit the invention to these embodiments. On the contrary, the invention is intended to cover alternatives, modifications and equivalents, which may be included within the spirit and scope of the invention as defined by appended claims.

Power distribution box 10 may be used to support a plurality of electrical components, such as, for example, within a portion of a vehicle 92 (see, e.g., FIG. 7A). It should be appreciated, however, that power distribution box 10 may be used in any appropriate environment and for any desired purpose.

Figure 1:
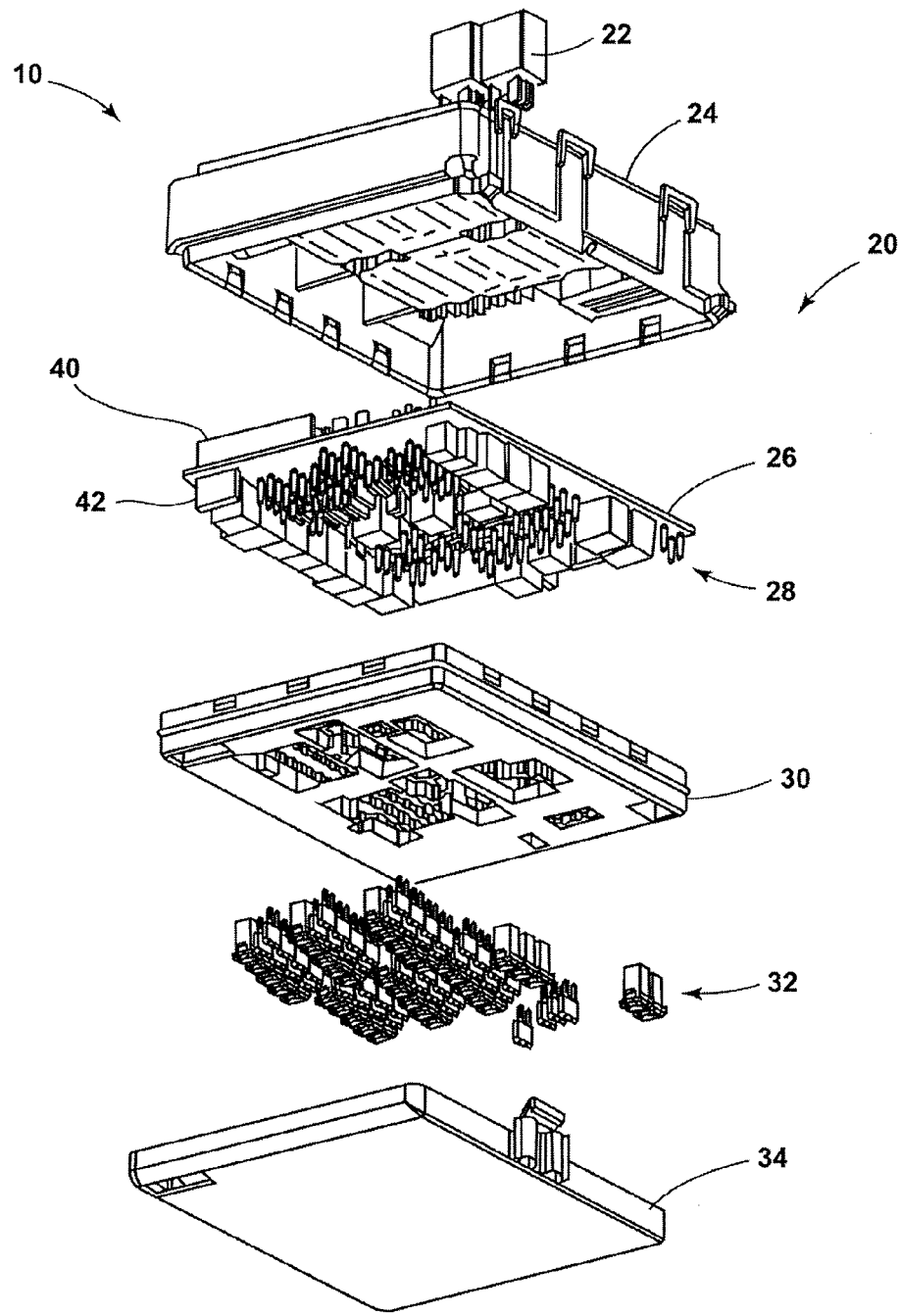
FIG. 1 is an exploded perspective view of portions of an embodiment of a power distribution box in accordance with teachings of the present disclosure.
Figure 2:
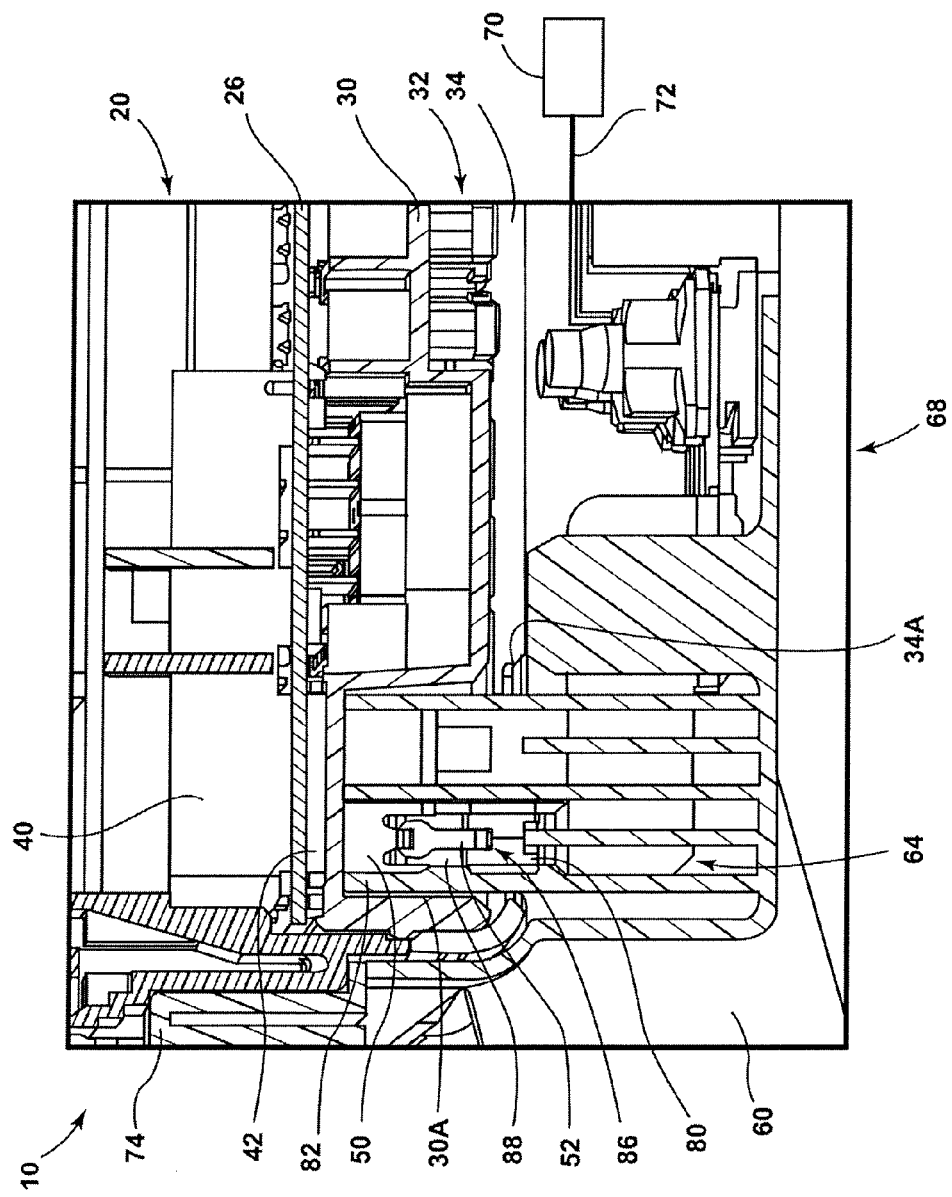
FIG. 2 is a partial cross-sectional perspective view of portions of an embodiment of a power distribution box in accordance with teachings of the present disclosure.

Referring to the drawings, FIG. 1 generally illustrates an exploded view of an embodiment of a first housing 20 of a power distribution box 10. First housing 20 may include relays 22, a relay housing 24, a circuit board 26, electrical components 28 connected to circuit board 26, a fuse housing 30, fuses 32, and/or a fuse cover 34. As generally illustrated in FIGS. 1 and 2, first housing 20 may include a bus bar 40 that may be connected, physically and/or electrically, to circuit board 26. Bus bar 40 may be configured to receive electrical power from second housing 60 and/or may be configured to distribute electrical power to circuit board 26 and/or other electrical components 28. Bus bar 40 may also be referred to herein as a circuit board bus bar. Bus bar 40 may include a generally vertical portion or projection 42 that may extend (e.g., downwardly) toward second housing 60. Vertical portion 42 may include a first connection element 50. In embodiments, vertical portion 42 and/or first connection element 50 may be disposed generally in or about a corner of first housing 20. In embodiments, bus bar 40, vertical portion 42, and/or first connection element may be formed as a single unitary element.

As generally illustrated in FIG. 2, power distribution box 10 may include first housing 20 and a second housing 60 that may be configured to be assembled together. In embodiments, an assembled configuration of first housing 20 and second housing 60 may include a cover 34 disposed between relay housing 24, circuit board 26, and/or fuse housing 30 on one side and second housing 60 on the other side. A top/exterior side 24A of relay housing 24 may include connecting areas or portions configured for connection with wiring harness connectors 100 (e.g., as generally illustrated in FIG. 7C).

In embodiments, second housing 60 may include a bus bar, such as a pre-fuse bus bar 62. Bus bar 62 may include a vertical portion 64 and/or a horizontal portion 66. Horizontal portion 66 may include projections, which may extend generally horizontally for connection with pre-fuses 68. Vertical portion 64 may be connected to horizontal portion 66 and may extend generally vertically upward toward first housing 20. Bus bar 62 may be configured to be electrically connected, for example, with a vehicle battery 70, which may be via one or more pre-fuses 68. Pre-fuses 68 may be connected to a power source, such as a vehicle battery 70, via one or more cables and/or wires 72 or other forms of connectors. In embodiments, pre-fuses 68 may be configured to regulate electrical power incoming to power distribution box 10 from a battery 70. In embodiments, second housing 60 may include a second connection element 80 that may be connected to and/or formed with vertical portion 64 of bus bar 62.

In embodiments, first connection element 50 and/or second connection element 80 may include one or more of a variety of shapes, sizes, and/or configurations. First connection element 50 and second connection element 80 may be configured to cooperate and/or engage with each other. For example, and without limitation, second connection element 80 may be configured as a female connection element, which may include being configured to receive some or all of first connection element 50 and/or vertical portion 42, and first connection element 50 may be configured as a male connection element, which may include being configured as a blade-type connector that may extend toward second connection element 80. Second connection element 80 may be configured as a receptacle for a blade-type connector. In other embodiments, first connection element 50 may be configured as a post-type connector and second connection element 80 may be configured to receive a post-type connector. In embodiments, at least one of first and second connection elements 50, 80 may include a resilient portion. For example, and without limitation, second connection element 80 may include resilient portion 90 that may be configured to be deflected upon insertion of first connection element 50. In embodiments, after first connection element 50 has been substantially inserted, resilient portion 90 may apply a spring force to first connection element 50 to retain first connection element 50 relative to second connection element 80. In other embodiments, first connection element 50 may be configured as a female connection element, and second connection element 80 may be configured as a male connection element. In embodiments, first and second connection elements 50, 80 may not include a male-female connection, and may comprise various other forms or features for connection or attachment.

Figure 3:
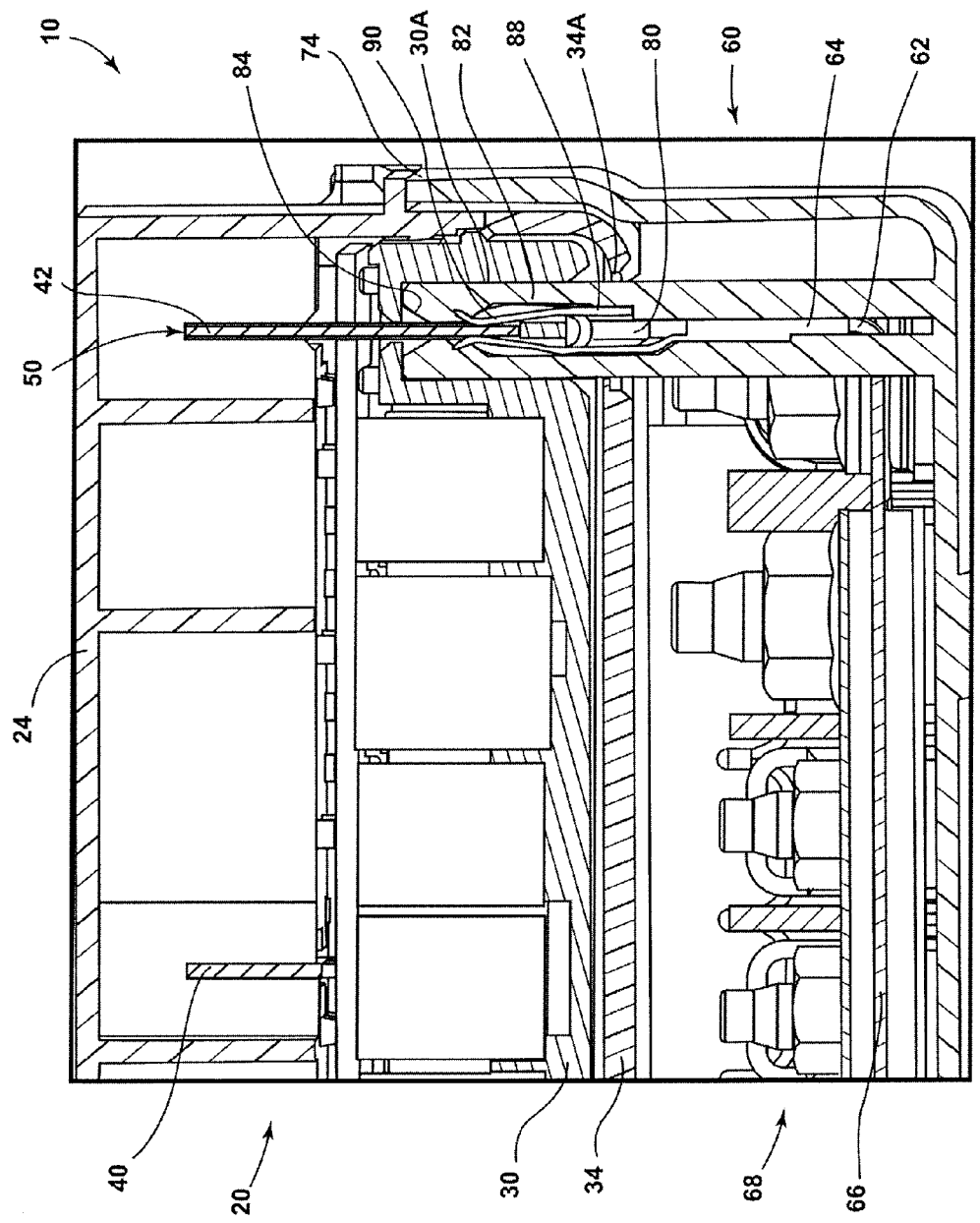
FIG. 3 is a partial cross-sectional perspective view of portions of an embodiment of a power distribution box in accordance with teachings of the present disclosure.

In embodiments, as generally illustrated in FIGS. 2 and 3, second connection element 80 may be configured to extend outwardly (e.g., vertically upward) from second housing 60 and into at least a portion of first housing 20. Second connection element 80 may include an insulating portion 82 that may electrically insulate at least a portion of second connection element 80. Insulating portion 82 may comprise electrically insulating material, such as plastic. Insulating portion 82 may include a shape that generally corresponds to an aperture 34A of cover 34 and/or a recess 30A of fuse housing 30, such that insulating portion 82 may extend into and/or through recess 30A and/or aperture 34A. In embodiments, insulating portion 82 may extend farther outward from second housing 60 than an electrically conducting portion 88 of second connection element 80 (e.g., insulating portion may extend into fuse housing recess 30A, but electrically conductive portion may only extend into cover aperture 34A). Insulating portion 82 may include an aperture 84 configured to receive a portion of first connection element 50. In embodiments, insulating portion 82 may include a cross-sectional area that corresponds to the cross-sectional area of recess 30A and/or aperture 34A. For example, and without limitation, insulating portion 82 may include a smaller cross-sectional area than aperture 84, but may include a cross-sectional area that is substantially the same as or slightly larger than the cross-sectional area of fuse housing recess 30A, which may correspond to an interference fit.

Figure 4:
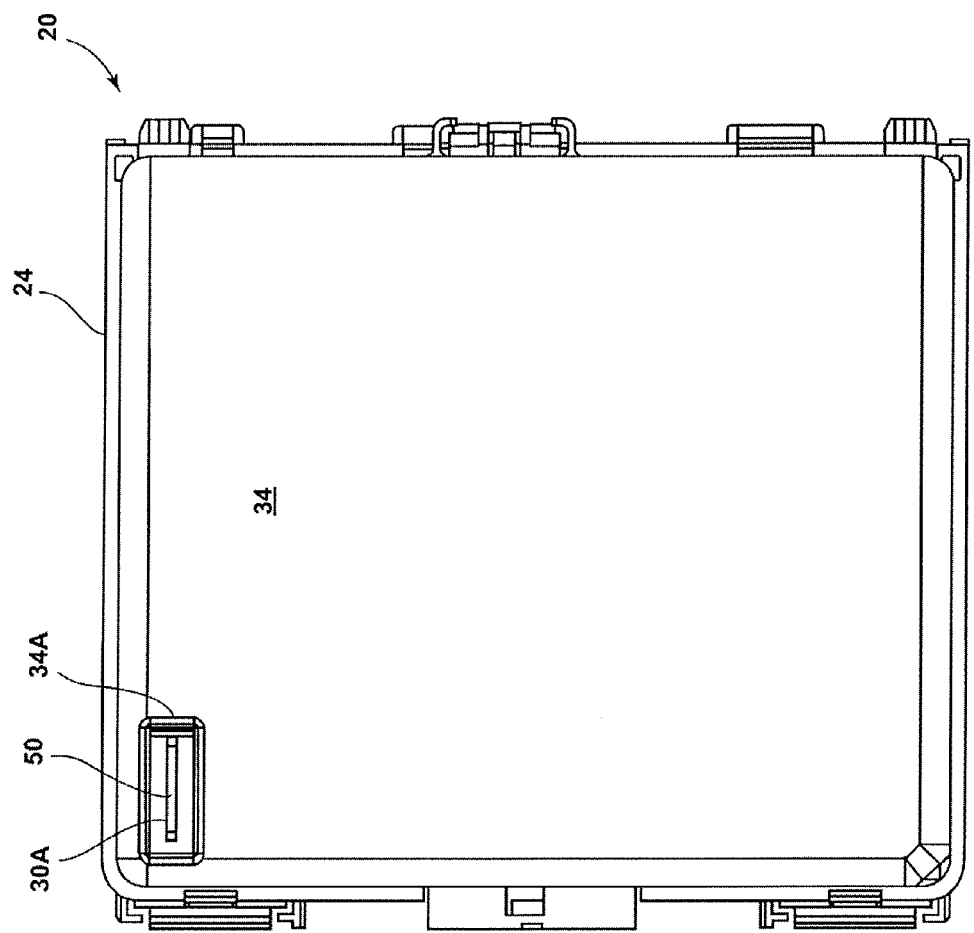
FIG. 4 is a bottom view of an embodiment of a first housing of a power distribution box in accordance with teachings of the present disclosure.

In embodiments, such as generally illustrated in FIGS. 2-4, bus bar 40 and/or first connection element 50 may extend through circuit board 26 and/or fuse housing 30. Cover aperture 34A may be aligned with first connection element 50 so that first connection element 50 is exposed to the exterior when first and second housings 20, 60 are not assembled together (e.g., as generally shown in FIG. 4). In embodiments, second connection element 80 may extend from second housing 60 and at least partially extend into fuse housing recess 30A and/or cover aperture 34A.

Figure 5:
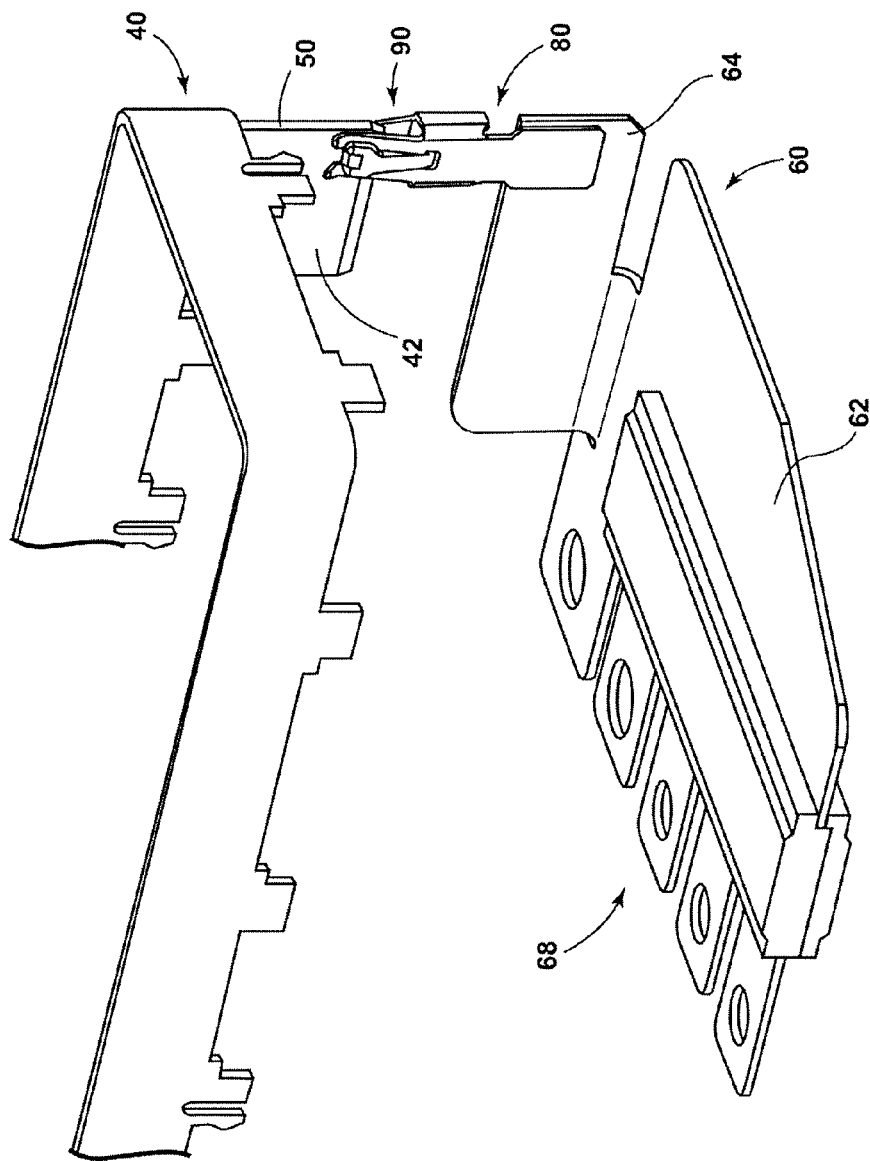
FIG. 5 is a perspective view of portions of an embodiment of a power distribution box in accordance with teachings of the present disclosure.
Figure 6:
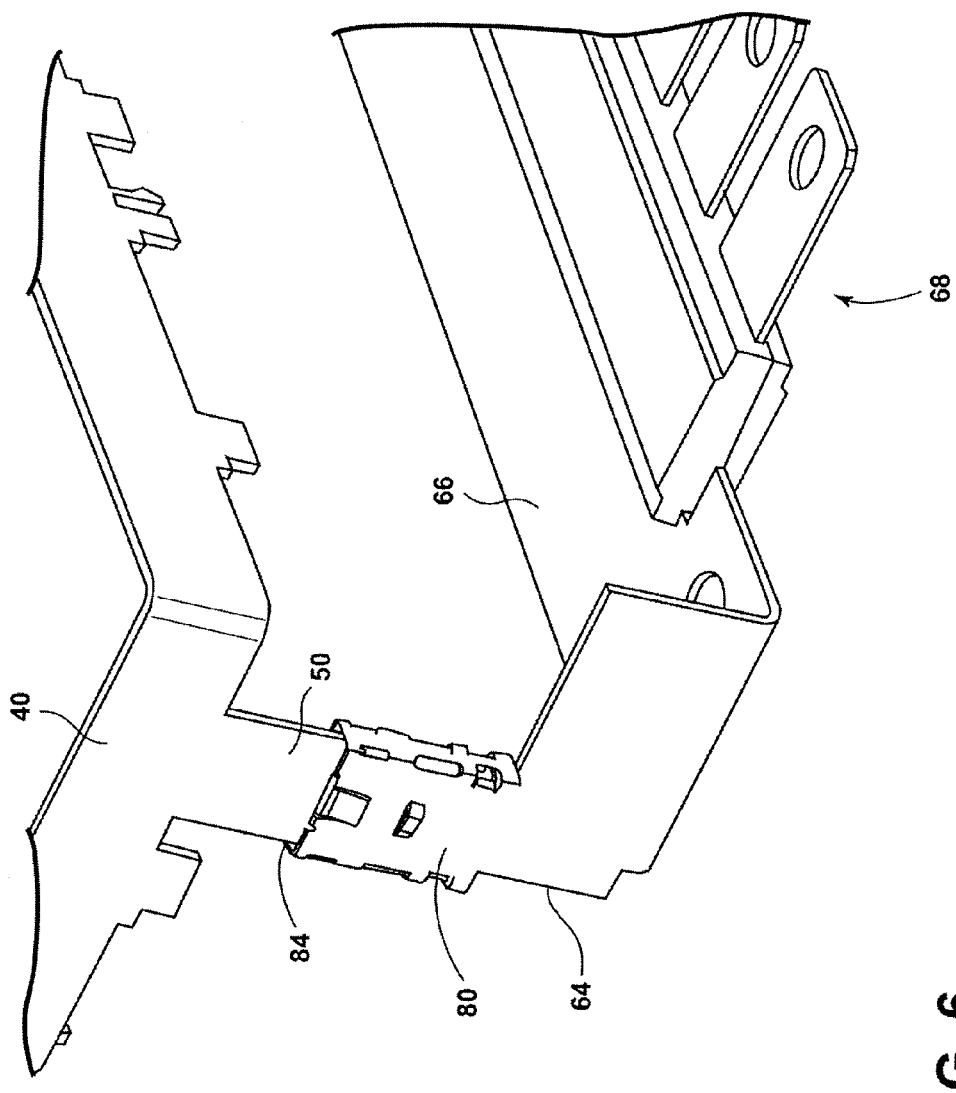
FIG. 6 is a perspective view of portions of an embodiment of a power distribution box in accordance with teachings of the present disclosure.

In embodiments, such as generally illustrated in FIG. 5, second connection element 80 may be welded to and/or otherwise permanently connected to bus bar 62. A configuration of second connection element 80 may depend on or relate to an intended use environment of second housing 60, such as an intended vehicle application, which may include a vehicle-specific configuration of first housing 20 (see, e.g., vehicle portion 92 in FIG. 7A). As described above, first connection element 50 of first housing 20 may include one or more of a variety of configurations, and those configurations may depend on an intended use or application. Second connection element 80 may be configured to complement the configuration of first connection element 50, which may permit second housing 60 to otherwise remain substantially the same for several different use environments (e.g., vehicles). In other embodiments, as generally illustrated in FIG. 6, second connection element 80 may be integrally formed with bus bar 62 and/or may include a single configuration that may be compatible with multiple configurations of first connection element 50.

In embodiments, first connection element 50 and second connection element 80 may be configured to provide an electrical connection between first housing 20 and second housing 60, such as between bus bar 40 and bus bar 62. For example, and without limitation, first and second connection elements 50, 80 may comprise one or more electrically conductive materials. In embodiments, first and second connection elements 50, 80 may be configured to provide the sole electrical connection between first and second housings 20, 60, which may include providing circuit board 26 with its sole source of electrical power. An electrical connection provided by first and second connection elements 50, 80 between first and second housings 20, 60 may not include (e.g., may be independent of) wires or cables. Electrical connections including wires often require fastening and unfastening of the wires with the assistance of tools (e.g., screwdrivers, wrenches, pliers, etc.) during assembly or disassembly. An electrical connection without wires or cables may simplify assembly and disassembly, which may allow the connection to be made and/or to be disconnected manually (e.g., without any tools).

In embodiments, first and second connection elements 50, 80 may, additionally or alternatively, be configured to physically retain first housing 20 and second housing 60 relative to each other. As described above, first and second connection elements 50, 80 may be configured as corresponding male and female connectors. Such male and female connectors may be configured such that they generally prevent substantial relative movement between first and second housings 20, 60 in a least one direction. For example, if first connection element 50 is configured as a male connector and is inserted into second element, which is configured as a female connector, first and second connection elements 50, 80 may prevent substantial relative horizontal movement between first and second housings 20, 60.

Additionally or alternatively, embodiments of first connection element 50 and/or second connection element 80 may include a vertically retaining feature. For example, and without limitation, first connection element 50 may include a clip 52 configured to selectively engage an aperture or recess 86 of second connection element 80. Clip 52 may be configured to deflect and/or rotate in and out of recess 86. Clip 52 may comprise a resilient material that may cause clip 52 to be biased into recess 86. Clip 52 may prevent relative vertical movement between first and second housings 20, 60. In embodiments, clip 52 may be configured for manual operation, which may include being configured such that clip 52 may be rotated in and out of recess 86 without any tools. In embodiments, second connection element 80 may include clip 52 and clip 52 may selectively engage first connection element 50.

In embodiments, first connection element 50 and second connection element 80 may be the only elements that positively physically retain first and second housings 20, 60 relative to each other. When engaged, first and second connection elements 50, 80 may provide a sufficient retaining force to substantially maintain the assembled positions of first and second housings 20, 60 during expected operating conditions and/or in an expected operating environment (e.g., operation of a vehicle). While first housing 20 and/or second housing 60 may include other physical retaining elements, such as tabs 74, that may passively limit relative movement, such retaining elements may not be configured for positive engagement. Such passive retaining elements may not include movable parts and may not be actuated, moved, and/or directly interacted with by an operator during assembly or disassembly. In embodiments, first and second connection elements 50, 80 may provide the only electrical connection and the sole positive physical connection between first and second housings 20, 60. Such a single electrical and physical connection arrangement may significantly simplify assembly and disassembly because the first and second housings 20, 60 may be disconnected from each other via only one connection. Often, in conventional designs, several physical connections must be disengaged, sometimes simultaneously and/or with the assistance of tools, to disconnect a power distribution box 10 or portions of a power distribution box 10 from a mounting position (e.g., in a vehicle 92). Additionally, in conventional designs, several electrical connections may also need to be disconnected, usually with tools, to disconnect a first housing 20 of power distribution box 10. In embodiments, first connection element 50 may be configured as a single projection from first housing 20 that corresponds to second connection element 80, which may be configured as a single projection from second housing 60 and include insulating portion 82 and/or electrically conductive portion 88. In embodiments, first and second connection elements 50, 80 may be disposed in corresponding corners of first and second housings 20, 60, respectively.

Simplified assembly may be particularly advantageous during initial assembly (e.g., on an assembly line), so that assembly time for assembly personnel and/or assembly equipment (e.g., a robot) can be reduced and/or minimized. In embodiments, second housing 60 may be configured to be mounted in a mounting location 94, which may include in an engine compartment of a vehicle 92. For example, and without limitation, second housing 60 may include mounting portions 76. Simplified disassembly may be particularly advantageous during maintenance, so that an operator/repair technician can quickly and manually (e.g., without tools) remove first housing 20 from a mounting location 94.

As generally illustrated in FIGS. 7A-7B, a method of assembly for a power distribution box 10 may include disposing second housing 60 near a mounting location 94 and then disposing second housing 60 at mounting location 94. Second housing 60 may be fastened to the mounting location 94 via one or more fasteners 96. As generally illustrated in FIG. 7C, first housing 20 may then be disposed generally above or over second housing 20, which may include aligning first connection element 50 and second connection element 80.

Figure 7D:
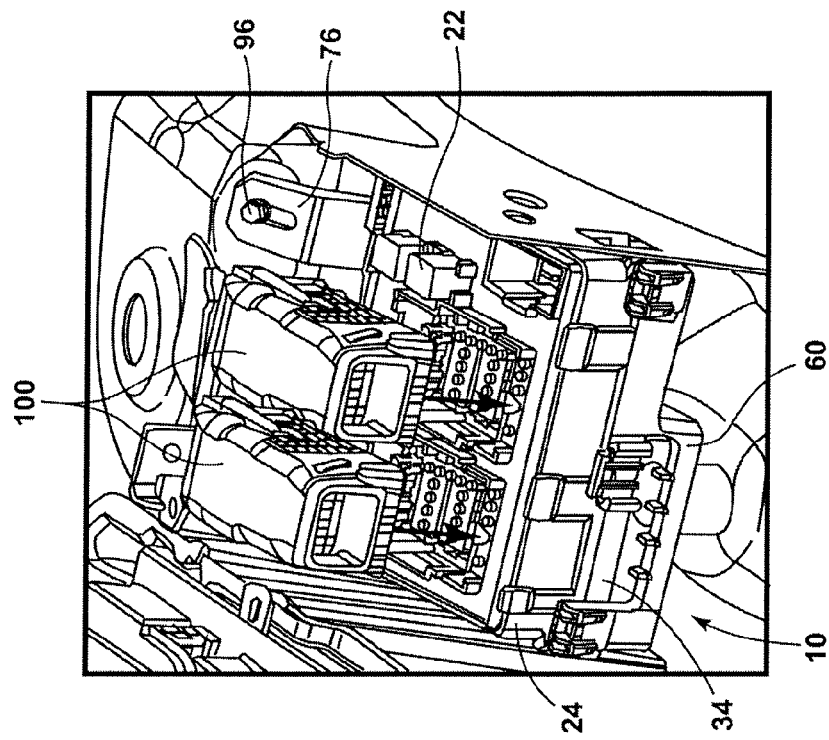
Figure 7C:
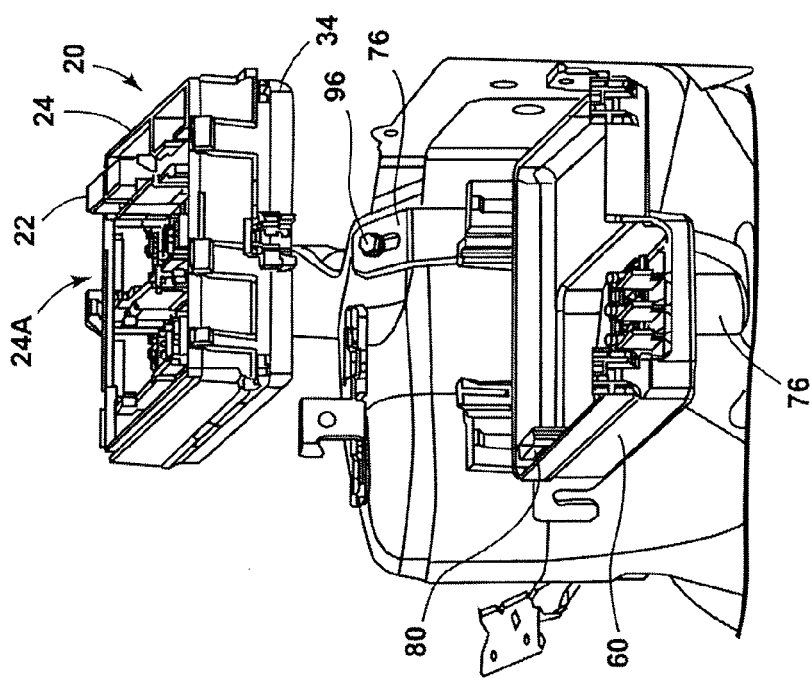

As generally illustrated in FIGS. 7C and 7D, first housing 20 may be moved (e.g., by applying a substantially vertically downward/perpendicular force) toward second housing 60 until first connection element 50 and second connection element 80 are fully engaged (e.g., as generally shown in FIGS. 2, 3, 5, and 6). As described above, engagement of first and second connection elements 50, 80 may provide the only electrical connection and/or the only positive physical connection necessary between first and second housing 20, 60. Also as described above, such a method of assembly may be accomplished manually by an operator/repair technician without the use of tools. Wiring harness connectors 100 may then be connected to first housing 20, which may include moving wiring harness connectors 100 vertically downward toward first housing 20. Various circuits routed to power distribution box 10 by wiring harness connectors 100 may receive power from power distribution box 10, electrically interact with relays 22 and 32, and/or be interconnected via circuit board 26.

In embodiments, first housing 20 may be disassembled from second housing 60 via a method corresponding to the assembly method described above. As an initial step, an operator may disengage first and second connection elements 50, 80, and may immediately thereafter (e.g., without disconnecting any other elements) remove first housing 20 from contact and/or connection with second housing 60 (e.g., second housing 60 may remain mounted to vehicle 92). Such disassembly may be accomplished manually, independently of tools.

In embodiments, first housing 20 may remain substantially stationary during assembly and/or disassembly. In such embodiments, assembly may include second housing 60 being moved toward first housing (e.g., by a substantially vertical/perpendicular force applied by an operator) to engage first and second connection elements 50, 80. Disassembly may include an operator disconnecting first and second connection elements 50, 80, and removing second housing 60 from any contact with first housing 20.

The foregoing descriptions of specific embodiments of the present invention have been presented for purposes of illustration and description. They are not intended to be exhaustive or to limit the invention to the precise forms disclosed, and various modifications and variations are possible in light of the above teaching. It should be understood that references to a single element are also intended to include embodiments that may include more than one of that element or zero of that element. It should also be understood that references to directions, such as vertical 64, horizontal 62, top, bottom, are provided for illustrative purposes only are not intended to limit the scope of the disclosure. For example, and without limitation, although first and second housings 20, 60 have been described as being assembled vertically/perpendicularly, embodiments of the present disclosure may include assembling first and second housings 20, 60 horizontally (which may be perpendicularly), or at an angle with respect to the vertical 64 and/or horizontal 62 directions, depending on the positioning of second housing 60.

The embodiments were chosen and described in order to explain the principles of the invention and its practical application, to thereby enable others skilled in the art to utilize the invention and various embodiments with various modifications as are suited to the particular use contemplated. It is intended that the scope of the invention be defined by the claims and their equivalents.

What is claimed is:
1. A power distribution box comprising:
a first housing comprising a first connection element; and
a second housing comprising a second connection element configured for engagement with the first connection element;
wherein the first and second connection elements are configured to retain the first housing relative to the second housing, and the first connection element and the second connection element are configured to electrically connect the first housing and the second housing;
wherein the first and second connection elements provide an electrical connection between a circuit board of the first housing and a pre-fuse bus bar of the second housing;

wherein the pre-fuse bus bar is configured to provide electrical power from a power source to the circuit board via the first and second connection elements.

2. The power distribution box of claim 1, wherein the first housing comprises a circuit board comprising at least one electrical component.

3. The power distribution box of claim 1, wherein the first and second connection elements are the sole elements that retain the first housing relative to the second housing.

4. The power distribution box of claim 1, wherein the first connection element and the second connection element are the sole elements that electrically connect the first housing and the second housing.

5. The power distribution box of claim 1, wherein the second housing is configured to be mounted to a portion of a vehicle.

6. The power distribution box of claim 5, wherein the first connection element and the second connection element permit the first housing to be removed from the vehicle without removing the second housing.

7. The power distribution box of claim 1, wherein the first connection elements includes a clip configured to selectively engage an aperture or recess of the second connection element.

8. The power distribution box of claim 7, wherein the second connection element is welded to the pre-fuse bus bar.

9. The power distribution box of claim 1, wherein the first and second connection elements are configured to prevent substantial relative movement between the first and second housings in a direction substantially perpendicular to the circuit board.

10. The power distribution box of claim 1, wherein the first housing includes a cover and a fuse housing, and wherein the second connection element is configured to extend through an aperture in the cover and into a recess of the fuse housing.

11. The power distribution box of claim 10, wherein the second connection element includes (i) an electrically conductive portion that extends into the aperture of the cover, and (ii) an insulating portion that extends into the recess of the fuse housing.

12. The power distribution box of claim 1, wherein the first housing includes a circuit board bus bar, and wherein the circuit board bus bar and the first connection element include a single unitary body.

13. The power distribution box of claim 1, wherein the first and second connection elements are configured to be manually engaged with each other and manually disengaged from each other, independently of tools.

14. A power distribution box comprising:
a circuit board bus bar disposed in a first housing, the circuit board bus bar comprising a first connection element;
a pre-fuse bus bar disposed in a second housing, the pre-fuse bus bar comprising a second connection element;
wherein one of the first connection element and the second connection element includes a projection and the other of the first connection element and second connection element is configured to receive at least a portion of the projection;
wherein the first connection element and the second connection element are configured to physically hold or retain the first housing and the second housing relative to each other in a direction substantially perpendicular to a circuit board of the first housing, and the first connection element and the second connection element are configured to provide an electrical connection between the circuit board bus bar and the pre-fuse bus bar.

15. The power distribution box of claim 14, wherein the second connection element is integrally formed with the pre-fuse bus bar.

16. The power distribution box of claim 14, wherein the first connection element and the second connection element are the sole elements that positively retain the first housing and the second housing relative to each other.

17. The power distribution box of claim 14, wherein the first connection element and the second connection element are the sole elements that are configured to provide an electrical connection between the circuit board bus bar and the pre-fuse bus bar.

18. A method of assembly of a power distribution box, the method comprising:
providing a first housing comprising a circuit board and a first connection element;
providing a second housing comprising a pre-fuse bus bar and a second connection element;
disposing the first housing relative to the second housing to align the first and second connection elements; and
applying a substantially vertical or perpendicular force to at least one of the first and second housings to cause at least one of the first and second housings to move toward the other and to cause at least one of the first and second connection elements to engage with the other;
wherein the first and second connection elements provide an electrical connection between the circuit board and the pre-fuse bus bar, and provide a sufficient physical retaining force to maintain an assembled position of the first housing and the second housing in an operating environment.

19. The method of claim 18, wherein the first and second connection elements are the only elements physically retaining first and second housings, and the first and second connection elements provide the sole electrical connection between the circuit board and the pre-fuse bus bar.

20. The method of claim 18, comprising manually disassembling the power distribution box by disengaging the first connection element and the second connection element independently of tools.

* * * * *